US012108672B2

(12) United States Patent
Weir et al.

(10) Patent No.: US 12,108,672 B2
(45) Date of Patent: Oct. 1, 2024

(54) SYSTEMS AND METHODS FOR ELECTRICAL POWER GENERATION

(71) Applicant: National Oilwell Varco, L.P., Houston, TX (US)

(72) Inventors: James William Weir, Cypress, TX (US); Travis James Miller, Cypress, TX (US); Frank Benjamin Springett, Spring, TX (US)

(73) Assignee: NATIONAL OILWELL VARCO, L.P., Houston, TX (US)

( * ) Notice: Subject to any disclaimer, the term of this patent is extended or adjusted under 35 U.S.C. 154(b) by 468 days.

(21) Appl. No.: 17/413,860

(22) PCT Filed: Dec. 20, 2019

(86) PCT No.: PCT/US2019/068048
§ 371 (c)(1),
(2) Date: Jun. 14, 2021

(87) PCT Pub. No.: WO2020/139780
PCT Pub. Date: Jul. 2, 2020

(65) Prior Publication Data
US 2022/0059747 A1     Feb. 24, 2022

Related U.S. Application Data

(60) Provisional application No. 62/785,538, filed on Dec. 27, 2018.

(51) Int. Cl.
| | | |
|---|---|---|
| H10N 10/13 | (2023.01) | |
| E21B 41/00 | (2006.01) | |
| F03G 4/00 | (2006.01) | |

(52) U.S. Cl.
CPC .......... *H10N 10/13* (2023.02); *E21B 41/0085* (2013.01); *F03G 4/00* (2021.08); *F03G 4/029* (2021.08)

(58) Field of Classification Search
CPC ....................................................... F03G 4/029
See application file for complete search history.

(56) References Cited

U.S. PATENT DOCUMENTS

| 4,407,126 A | 10/1983 | Aplenc |
|---|---|---|
| 4,586,339 A | 5/1986 | Reid et al. |

(Continued)

FOREIGN PATENT DOCUMENTS

| CN | 103001533 A | 3/2013 |
|---|---|---|
| CN | 108756821 A | 11/2018 |

(Continued)

OTHER PUBLICATIONS

European Patent Application No. 19906215.9 extended European search report dated Jul. 20, 2022 (8 pages).

(Continued)

*Primary Examiner* — Ryan S Cannon
(74) *Attorney, Agent, or Firm* — CONLEY ROSE, P.C.

(57) ABSTRACT

Power generation assemblies and methods relating thereto are disclosed. In an embodiment, the power generation assembly includes a thermoelectric generator, and a conductor configured to conduct electricity generated by the thermoelectric generator to the surface of a subterranean wellbore. The power generation assembly is to circulate a working fluid through a closed loop in the power generation assembly in response to the receipt of geothermal energy within a subterranean formation, to cause the thermoelectric generator to generate electricity.

14 Claims, 3 Drawing Sheets

(56) References Cited

U.S. PATENT DOCUMENTS

| | | | |
|---|---|---|---|
| 5,839,508 | A | 11/1998 | Tubel et al. |
| 7,849,690 | B1 | 12/2010 | Lakic |
| 8,434,554 | B2 | 5/2013 | Viernickel |
| 9,995,286 | B2 | 6/2018 | Lakic |
| 2003/0010652 | A1 | 1/2003 | Hunt |
| 2008/0223032 | A1 | 9/2008 | Sumrall |
| 2009/0320475 | A1 | 12/2009 | Parrella |
| 2010/0223924 | A1 | 9/2010 | Cargill |
| 2012/0174581 | A1 | 7/2012 | Vaughan et al. |
| 2015/0027507 | A1* | 1/2015 | Noui-Mehidi ......... H10N 10/13 136/201 |
| 2015/0107244 | A1 | 4/2015 | Lakic |
| 2015/0204315 | A1* | 7/2015 | Rodriguez-Arango ...................... F01K 3/008 60/653 |
| 2015/0285226 | A1 | 10/2015 | Archambeau et al. |
| 2015/0330670 | A1 | 11/2015 | Wynn, Jr. |
| 2016/0160845 | A1 | 6/2016 | Weaver et al. |
| 2021/0364194 | A1* | 11/2021 | Gleadhill ............... H10N 10/13 |

FOREIGN PATENT DOCUMENTS

| | | | |
|---|---|---|---|
| KR | 20150129974 A | | 11/2015 |
| WO | WO-2016138389 A1 | * | 9/2016 |

OTHER PUBLICATIONS

European Office Action dated Jan. 23, 2024, for European Application No. 19906215.9 (5 p.).

Canadian Office Action dated Jan. 23, 2024, for Canadian Application No. 3,124,652 (3 p.).

International Patent Application No. PCT/US2019/068048 International Search Report and Written Opinion dated Apr. 27, 2020 (16 pages).

* cited by examiner

SYSTEMS AND METHODS FOR ELECTRICAL POWER GENERATION

CROSS-REFERENCE TO RELATED APPLICATIONS

This application is a National Phase Entry into the U.S. under 35 U.S.C. § 371 of and claims priority to PCT Application No. PCT/US2019/068048, filed Dec. 20, 2019, entitled "Systems And Methods For Electrical Power Generation" which claims benefit of U.S. provisional patent application Ser. No. 62/785,538 filed Dec. 27, 2018, and entitled "Systems And Methods For Electrical Power Generation," the entire contents of each being incorporated herein by reference for all purposes.

STATEMENT REGARDING FEDERALLY SPONSORED RESEARCH OR DEVELOPMENT

Not applicable.

BACKGROUND

This disclosure generally relates to electrical power generation. More particularly, some embodiments of this disclosure relate to systems and methods for generating electrical power utilizing geothermal energy accessed from a bore extending from the surface into a subterranean formation.

Bore holes are commonly drilled from the surface to access minerals or other resources (e.g., oil, gas, water, etc.) that exist within subterranean formations. The internal heat of the Earth (e.g., residual heat from the Earth's formation, heat generated by radioactive elements beneath the Earth's surface, etc.) typically induces an increasing temperature gradient per increasing depth within such bore holes (e.g., at a rate of approximately 1° F. per 70 vertical feet in some locations). The elevated temperatures within these bore holes are potential sources of energy that may be harnessed to provide power (e.g., electrical power) at the surface.

BRIEF SUMMARY OF THE DISCLOSURE

Some embodiments disclosed herein are directed to a system including a power generation assembly. The power generator assembly is configured to be enclosed within a wellbore extending from the surface into a subterranean formation along a central axis. Wherein the power generation assembly includes a thermoelectric generator, and a conductor configured to conduct electricity generated by the thermoelectric generator to the surface. The power generation assembly is configured to circulate a working fluid through a closed loop in the power generation assembly in response to the receipt of geothermal energy within the subterranean formation, to cause the thermoelectric generator to generate electricity.

Other embodiments disclosed herein include a power generation assembly. In an embodiment, the power generation assembly includes a first barrier and a second barrier spaced from one another along a central axis. In addition, the power generation assembly includes a first chamber, a second chamber, and a third chamber. The first chamber, the second chamber, and the third chamber are bounded by the first barrier and the second barrier, and the second chamber is axially disposed between the first barrier and the second barrier. Further, the power generation assembly includes a central housing defining a central throughbore and an annular flow path in the second chamber. Still further, the power generation assembly includes a thermoelectric generator disposed within the second chamber radially between the central throughbore and the annular flow path, and a working fluid disposed in each of the first chamber, the second chamber, and the third chamber. The central throughbore and the annular flow path are in fluid communication with the first chamber and the third chamber. When the first chamber is exposed to a first temperature and the second chamber is exposed to a second temperature that is higher than the first temperature the working fluid flows through the central throughbore at a third temperature and flows through the annular flow path at a fourth temperature that is less than the third temperature.

Still other embodiments are directed to a method of generating electrical power. In an embodiment, the method includes (a) positioning a power generation assembly in a wellbore extending into a subterranean formation, and (b) transferring heat from the formation into a working fluid disposed within the power generation assembly. In addition, the method includes (c) circulating the working fluid within a closed loop in the power generation assembly as a result of (b). Further, the method includes (d) exposing a thermoelectric generator of the power generation assembly to a temperature gradient using the circulating working fluid during (c). Still further, the method includes (e) generating electric current with the thermoelectric generator as a result of (d).

Embodiments described herein comprise a combination of features and characteristics intended to address various shortcomings associated with certain prior devices, systems, and methods. The foregoing has outlined rather broadly the features and technical characteristics of the disclosed embodiments in order that the detailed description that follows may be better understood. The various characteristics and features described above, as well as others, will be readily apparent to those skilled in the art upon reading the following detailed description, and by referring to the accompanying drawings. It should be appreciated that the conception and the specific embodiments disclosed may be readily utilized as a basis for modifying or designing other structures for carrying out the same purposes as the disclosed embodiments. It should also be realized that such equivalent constructions do not depart from the spirit and scope of the principles disclosed herein.

BRIEF DESCRIPTION OF THE DRAWINGS

For a detailed description of various exemplary embodiments, reference will now be made to the accompanying drawings in which.

DETAILED DESCRIPTION OF EXEMPLARY EMBODIMENTS

Figure 1:
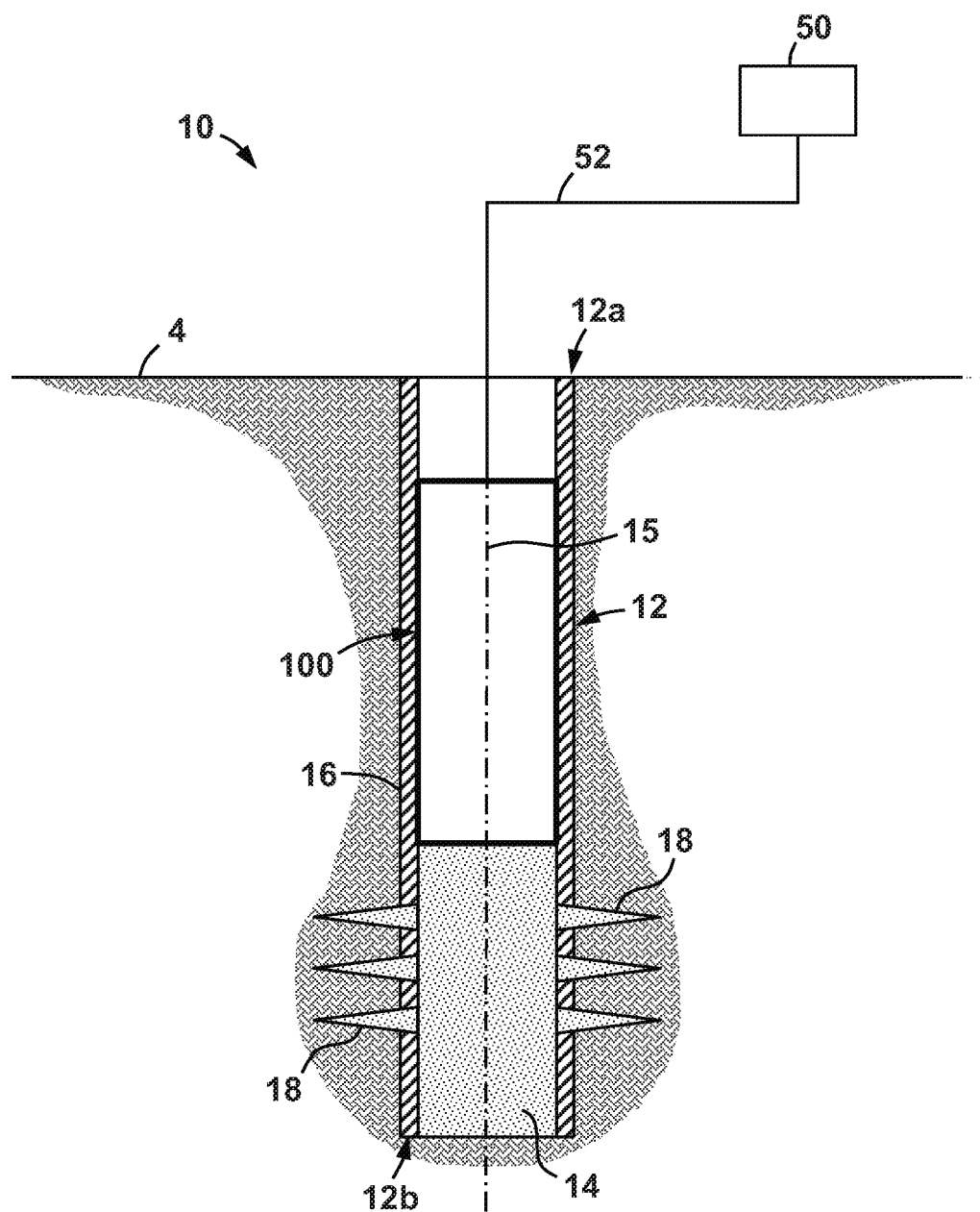
FIG. 1 is a schematic view of a geothermal power generation system according to some embodiments disclosed herein.

The following discussion is directed to various exemplary embodiments. However, one of ordinary skill in the art will understand that the examples disclosed herein have broad application, and that the discussion of any embodiment is meant only to be exemplary of that embodiment, and not intended to suggest that the scope of the disclosure, including the claims, is limited to that embodiment.

The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection of the two devices, or through an indirect connection that is established via other devices, components, nodes, and connections. In addition, as used herein, the terms "axial" and "axially" generally mean along or parallel to a given axis (e.g., central axis of a body or a port), while the terms "radial" and "radially" generally mean perpendicular to the given axis. For instance, an axial distance refers to a distance measured along or parallel to the axis, and a radial distance means a distance measured perpendicular to the axis. As used herein, the terms substantial, substantially, generally, about, approximately, and the like mean +/−10%. Finally, any reference to up or down in the description and the claims is made for purposes of clarity, with "up", "upper", "upwardly", "uphole", or "upstream" meaning toward the surface of the wellbore or borehole and with "down", "lower", "downwardly", "downhole", or "downstream" meaning toward the terminal end of the wellbore or borehole, regardless of the wellbore or borehole orientation.

As previously described above, elevated temperatures found within the lower regions of subterranean boreholes are a potential thermal energy source that may be harnessed to generate power (e.g., electrical power) for use at the surface. One common type of borehole that is formed in a subterranean formation is that associated with an oil and gas well. Typically, these wells may be drilled to a depth of 5000 to 10000 feet below the surface (depending the specific location), and may have a bottom hole temperature close to or over 300° F. There are a great number of such wells that have been drilled to access oil and gas reserves worldwide over the last two centuries. Once hydrocarbon production ceases or falls below an economic threshold, these wells are typically plugged (e.g., with cement/plugs, etc.) and abandoned. The costs for performing these operations may be considerable in some circumstances. However, these abandoned wells may still serve as an effective access point for the geothermal energy stored within the Earth. Therefore, embodiments disclosed herein include systems and methods for generating electrical power from the geothermal energy emitted into a subterranean wellbore, such as, for example, an abandoned oil and gas well). In addition, as will be described in more detail below, the systems and methods disclosed herein may also be utilized to generate electrical power from other sources of thermal energy (i.e., other than a geothermal energy source).

Referring now to FIG. 1, a geothermal power generation system according to some embodiments is shown. System 10 generally includes a wellbore 12 extending into a subterranean formation 6 from the surface 4. Wellbore 12 includes a central axis 15, a first end or upper end 12a, and a second or lower end 12b opposite upper end 12a. Upper end 12a is disposed at the surface 4, and lower end 12b is disposed within the subterranean formation 6. In this embodiment, wellbore 12 is substantially vertical, such that axis 15 is generally aligned with the vertical direction (e.g., along the direction of gravity). However, in other embodiments, one or more sections or portions of wellbore 12 may be non-vertically oriented (e.g., lateral). A casing or liner pipe 16 (or more simply casing 16) is disposed within wellbore 12 and is secured in place. In some embodiments, casing 16 is cemented within the wellbore 12 so as to prevent formation fluids (e.g., oil, gas, water, etc.) from migrating to the surface 4 between the casing 16 and the wall of wellbore 12. A plurality of perforations 18 extend through casing 16 and into formation 6 to provide a pathway for formation fluids into casing 16 and ultimately the surface 4.

In this embodiment, wellbore 12 is abandoned, and thus is plugged to prevent formation fluids from progressing into casing 16 and up to surface 4. In particular, in this embodiment cement 14 fills the lower portion of wellbore 12, from lower end 12b to a point above perforations 18. In other embodiments, a mechanical plug or seal may be placed within casing 16 above perforations 18 to similarly prevent the flow of formation fluids to surface 4 via casing 16. In still other embodiments, a combination of mechanical plugs and cement may be used to plug and abandon wellbore 12.

Referring still to FIG. 1, as previously described above, the internal temperature gradient of the Earth's crust results in an increasing temperature gradient when moving along axis 15 from the surface 4 within wellbore 12, from upper end 12a toward lower end 12b. Thus, the temperature within wellbore 12 may be higher proximate lower end 12b than it is proximate upper end 12a. Thus, system 10 also includes a power generation assembly 100 that is installed within wellbore 12 (particularly within casing 16) and is configured to harness the temperature difference within the wellbore 12 to generate electrical power. Once generated, the electrical power may be conducted to the surface 4 via a conductor 52 (or a plurality of conductors) and delivered to a final location 50, which may include a local power grid, one or more batteries, capacitors, or other power storage assemblies.

It should be appreciated that power generation assembly 100 is enclosed or encapsulated within wellbore 12. Thus, in this embodiment, each of the components of power generation assembly 100 are disposed downhole (e.g., within wellbore 12) such that only electric current (e.g., via conductor 52) is brought back up to the surface 4. As a result, power generation assembly 100 may require little to no surface space. The details of one embodiment of power generation assembly 100 will now be discussed in more detail below.

Figure 2:
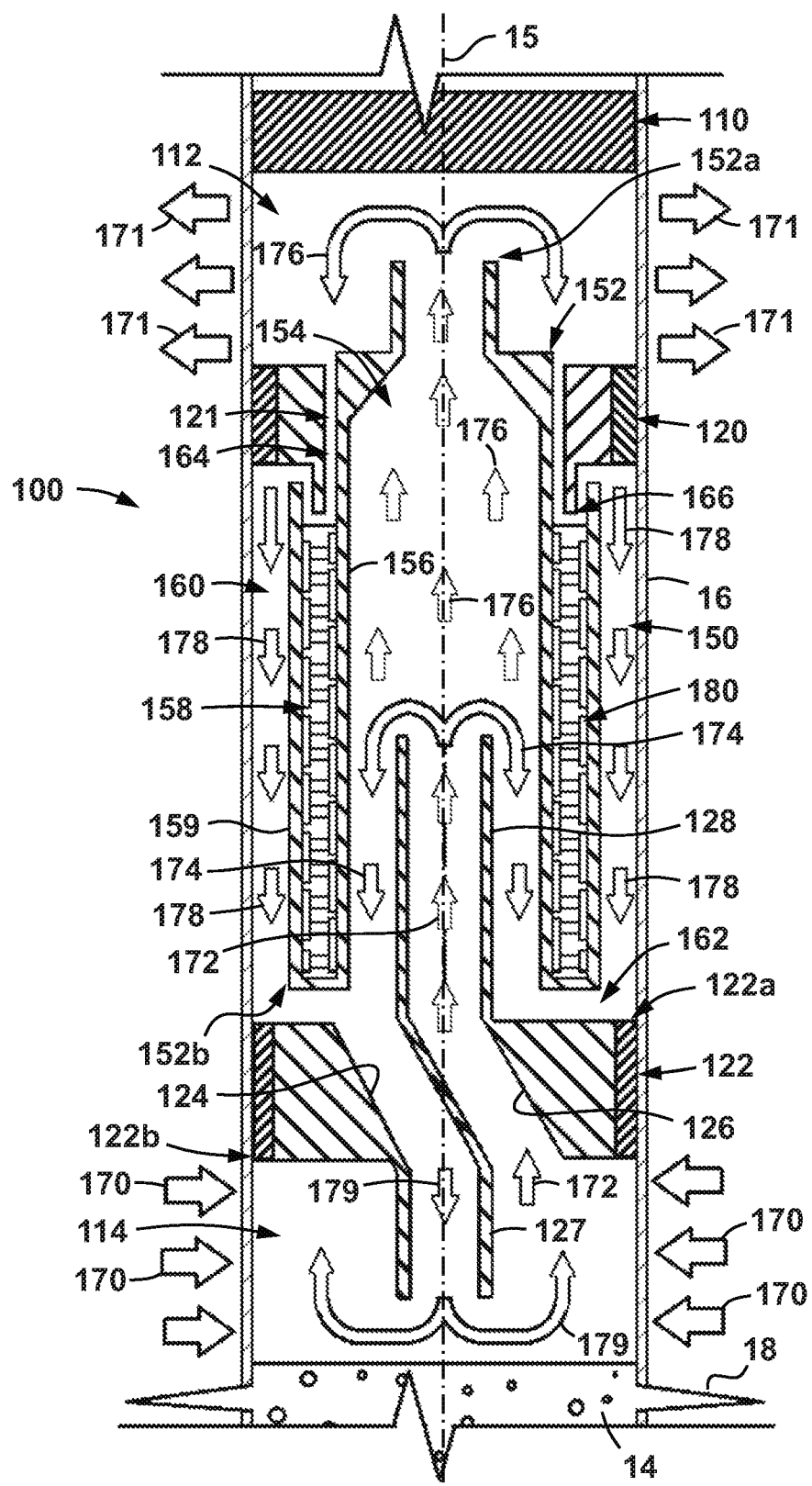
FIG. 2 is side cross-sectional view of a power generation assembly for use within the system of FIG. 1 according to some embodiments disclosed herein.

Referring now to FIG. 2, an embodiment of power generation assembly 100 is shown installed within casing 16 of wellbore 12 (see FIG. 1). Power generation assembly 100 includes a first or upper barrier 110, a second or lower barrier 122, and a third or middle barrier 120. Each of the barriers 110, 122, 120 are axially spaced from one another along axis 15 and each sealingly engages with the inner wall of casing 16. In this embodiment, lower barrier 122 is proximate to and axially above cement 14 and perforations 18, and middle barrier 120 is axially disposed between upper barrier 110 and lower barrier 122. Thus, upper barrier 110 is uphole of middle barrier 120 and lower barrier 122, middle barrier 120 is downhole of upper barrier 110 and uphole of lower barrier 122, and lower barrier 122 is downhole of each of the upper barrier 110 and middle barrier 120.

A first or upper chamber 112 is defined between upper barrier 110 and middle barrier 120, a second or lower chamber 114 is defined between lower barrier 122 and cement 14, and a third or middle chamber 150 is defined between middle barrier 120 and lower barrier 122. Thus, upper chamber 112 is uphole of middle chamber 150 and lower chamber 114, middle chamber 150 is downhole of upper chamber 112 and uphole of lower chamber 114, and lower chamber 114 is downhole of each of the upper chamber 112 and middle chamber 150. In this embodiment, because power generation assembly 100 is installed and incorporated within casing 16 wellbore 12, barriers 110, 120, 122 comprise plugs that are installed within casing 16.

Upper chamber 112 may be disposed within an axial section or portion of wellbore 12 that is at a first temperature, and lower chamber 114 may be disposed within an axial section or portion of wellbore 12 that is at a second temperature that is higher than the first temperature. For example, in some embodiments, the first temperature about the upper chamber 112 may range from 70° F. to 120° F., and the second temperature about the lower chamber 114 may range from 180° F. to 300° F. The axial length of chambers 112, 114, 150 may be adjusted so as to place the upper and lower chambers 112 and 114, respectively, at predetermined depths to achieve a desired temperature difference therebetween.

Referring still to FIG. 2, middle barrier 120 includes a central throughbore 121 extending axially therethrough. In addition, lower barrier 122 includes a first or upper end 122a, a second or lower end 122b opposite upper end 122a, a first port 124 extending axially between ends 122a, 122b, and a second port 126 also extending axially between ends 122a, 122b that is separate from the first port 124. A first conduit 127 extends axially from lower end 122b toward cement 14 (e.g., first conduit 127 extends axially downward or downhole) and is in fluid communication with first port 124. A second conduit 128 extends axially from upper end 122a toward middle barrier 120 (e.g., second conduit 128 extends axially upward or uphole) and is in fluid communication with second port 126. Thus, the first conduit 127 and first port 124 define a first flow path through lower barrier 122 from middle chamber 150 to lower chamber 114, and second conduit 128 and second port 126 define a second flow path through lower barrier 122 from middle chamber 150 to lower chamber 114.

A central housing 152 is disposed within middle chamber 150. In particular, central housing 152 is disposed axially between upper barrier 110 and lower barrier 122 and extends axially through central throughbore 121 in middle barrier 120. Housing 152 includes a first or upper end 152a, a second or lower end 152b opposite upper end 152a, and a central throughbore 154 extending axially between ends 152a, 152b. Upper end 152a is disposed within upper chamber 112 and lower end 152b is disposed within middle chamber 150 proximate lower barrier 122. Therefore, second conduit 128 coupled to lower barrier 122 extends into throughbore 154 of central housing 152.

An annular pocket 158 is defined within housing 152 that is radially formed between a radially inner annular wall 156 and a radially outer annular wall 159. Radially inner annular wall 156 forms a portion of central throughbore 154. A thermoelectric generator 180 is disposed within pocket 158 radially between annular walls 156, 159 that is configured to generate electric current when exposed to two different temperatures. Specifically, generator 180 generates electric current when a radial temperature gradient is applied thereto via the Seebeck Effect. The construction of a thermoelectric generator (e.g., like generator 180) is well known and therefore, the details of such a construction are not described in detail herein; however, in general, electric generator 180 includes dissimilar metallic materials that are exposed (during operation of power generation assembly 100) to different temperatures via radial annular walls 156, 159 to thereby generate electric current which is conducted to the surface 4 (e.g., via conductor 52 shown in FIG. 1).

An annular flow path 160 is defined radially between casing 16 and radially outer annular wall 159 that extends axially from middle barrier 120 to a manifold region 162 within middle chamber 150 that is axially disposed between lower end 152b of central housing 152 and lower barrier 122. The manifold region 162 is also in fluid communication with central throughbore 154 of housing 152 via lower end 154b of central housing 152 and with lower chamber 114 via first port 124 and first conduit 127. Thus, annular flow path 160 is in fluid communication with lower chamber 114 via manifold region 162. In addition, annular flow path 160 is in fluid communication with upper chamber 112 via a flow path 164 defined between upper barrier 120 and central housing 152. Flow path 164 is an annular flow path that includes a U-bend 166. As will be described in more detail below, U-bend 166 prevents or restricts gases from flowing or advancing axially upward from annular flow path 160 into upper chamber 112 during operations.

Referring still to FIG. 2, during operations, a working fluid, such as, for example a refrigerant is circulated within power generation assembly 100 to expose thermoelectric generator 180 to two different temperatures. As a result, thermoelectric generator 180 may generate electric current which is supplied to the surface (e.g., surface 4) via a suitable conductor or conductors (e.g., conductor 52 shown in FIG. 1).

In particular, in this embodiment, the working fluid circulated within power generation assembly 100 may comprise a multi-component fluid, such as, for example, a two component fluid. Thus, the working fluid may comprise a first fluid and a second fluid. The first fluid may have a first boiling point, and the second fluid may have a second boiling point that is higher than the first boiling point. In the following example, the circulated fluid within power generation assembly comprises an ammonia and water mixture; however, it should be appreciated that other fluid combinations may be used in other embodiments, and the ammonia-water mixture discussed below is merely one potential example multi-component working fluid that may be circulated within power generation assembly 100.

In addition, initially the annular flow path 160 may be charged with a gas that is different from the components of the working fluid. In some embodiments, the gas charged within annular flow path 160 may be inert. In the following particular example, the gas charged within annular flow path 160 is helium; however, it should be appreciated that other gases may be used in other embodiments. It should also be appreciated that the gas charged within annular flow path 160 (e.g., helium in the following described example) pressurizes the working fluid within power generation assembly 180 such that during the following operations, the circulated working fluid is maintained at a substantially constant pressure. In some embodiments, the pressure of the working fluid circulated within power generation assembly 180 may be maintained within range of −14.7 psig (−1 bar) to 150 psig (10 bar) during operations. In other words, the circulation of the working fluid within power generation assembly 180 (which is described in more detail below) is achieved via changes in state (e.g., from liquid to gas or from gas to liquid) and via the transfer of thermal energy, and not from an induced differential pressure (e.g., such as from a mechanical pump, compressor, or the like).

Referring still to FIG. 2, during operations of one specific implementation, a mixture of ammonia and water (as previously described above) is disposed within lower chamber 114 as the working fluid. As previously described above, lower chamber 114 is disposed at a lower depth within the wellbore 12 and thus is exposed to relatively high geothermal temperatures. As a result, geothermal energy is transferred from the formation (e.g., formation 6 in FIG. 1), through casing 16 and into the lower chamber 114 (see e.g., arrows 170 in FIG. 2) so that the ammonia-water mixture within lower chamber 114 boils and emits ammonia-water vapors.

The ammonia-water vapors are then flowed (e.g., via natural convection) axially upward through second port 126 and second conduit 128 and are emitted into throughbore 154 of central housing 152 (see e.g., arrows 172 in FIG. 2). The expansion of the ammonia-water vapors into throughbore 154 and the relatively lower temperature within throughbore 154 (e.g., compared to lower chamber 114), cause the water component of the vapors to condense within throughbore 154 and settle axially downward into manifold region 162 (see e.g., arrows 174 in FIG. 2). Conversely, the ammonia vapors emitted from second conduit 128 (which have a lower boiling point than the water) continue upward in a gaseous state and are emitted from throughbore 154 into upper chamber 112 via upper end 152a of central housing 152 (see e.g., arrows 176 in FIG. 2). Therefore, during operations, the radially inner wall 156 of annular pocket 158 within central housing 152 is exposed to the relatively high temperatures of the ammonia and water vapors flowing through throughbore 154. In some embodiments, the radially inner wall 156 may be exposed to temperatures ranging from 180° F. to 300° F. during these operations.

Referring still to FIG. 2, upon entering upper chamber 112, the heated ammonia vapors are exposed to the relatively lower temperatures of upper chamber 112 that result from the relatively lower temperature of the formation (e.g., formation 6 in FIG. 1) at the shallower depth of chamber 112. Accordingly, upon entering the upper chamber 112, thermal energy is transferred from the ammonia vapors back into the formation (see e.g., arrows 171 in FIG. 2) such that the ammonia vapors cool and condense to a liquid that then flows through flow path 164 into annular flow path 160. As previously described, the annular flow path 160 is filled with a gas, which in this example comprises helium. The helium is prevented from flowing back up through flow path 164 into upper chamber 112 by liquid ammonia that is disposed within U-bend 166 of flow path 164. Upon entering annular flow path 160, the ammonia liquid is exposed to the helium gas and therefore expands (e.g., evaporates) or diffuses back into a gaseous state as it generally flows or progresses axially downward through annular flow path 160 toward manifold region 162 (see e.g., arrows 178 in FIG. 2).

The evaporation of the ammonia liquid into gas within annular flow path 160 cools the ammonia significantly so that the annular wall 159 defining annular flow path 160 is exposed to relatively low temperatures. For example, in some embodiments, the radially outer wall 159 may be exposed to temperatures ranging from −40° F. to 0° F. during these operations. Thus, thermoelectric generator 180 is exposed to a relatively large temperature difference or gradient between the radially inner wall 156 and radially outer wall 159 of annular pocket 158. For example, in some embodiments, the temperature difference between the radially inner wall 156 and radially outer wall 159 may range from 175° F. to 340° F. Because the electrical current generation of thermoelectric generator 180 may be directly proportional to the temperature difference that is applied thereto, this relatively large temperature difference may allow thermoelectric generator 180 to generate a relatively large amount of electric current. In addition, thermoelectric generators (e.g., such as generator 180) may also operate a greater efficiencies in lower temperature environments. Thus, by additionally cooling the working fluid (e.g., ammonia) as it flows through the annular flow path 160, the overall temperature exposed to the thermoelectric generator 180 may be decreased such that generator 180 may operate at an enhanced efficiency.

Referring still to FIG. 2, as the evaporated ammonia vapors flow axially downward toward manifold region 162, they are once again condensed back into a liquid such that the liquefied ammonia may be mixed with the liquid water within manifold region 162 (which was condensed from throughbore 154 as previously described above—see e.g., arrows 174). Thereafter, the ammonia-water mixture may be flowed from manifold region 162 back into lower chamber 114 via first port 124 and first conduit 127 (see e.g., arrows 179 in FIG. 2) such that the above described cycle may be repeated.

As a result, during operations with power generation assembly 100, a working fluid (e.g., a refrigerant such as the ammonia-water mixture previously described above) is continuously circulated in a closed-loop at a relatively constant pressure to thereby expose thermoelectric generator to a large temperature gradient. Accordingly, through use of the geothermal temperature gradient along axis 15 of wellbore 12, power generation assembly 180 may generate electric current that is conducted to the surface 4 via a suitable conductor or conductors (e.g., conductor 52 in FIG. 1).

In the embodiment described above, power generation assembly 100 (see FIG. 2) is incorporated within the casing 16 of a subterranean wellbore 12. However, in other embodiments, the power generation assembly (e.g., assembly 100) may be a self-contained unit or assembly that is constructed at the surface (e.g., surface 4 in FIG. 1) and lowered into the wellbore (e.g., wellbore 12). For example, referring now to FIG. 3, a power generation assembly 200 is shown. Power generation assembly 200 is generally the same as power generation assembly 100, and thus, components of power generation assembly 200 that are shared with power generation assembly 100 are identified with like reference numerals and the description below will focus on the features of power generation assembly 200 that are different from power generation assembly 100.

Primarily, power generation assembly 200 omits upper barrier 110 and instead includes an outer housing 202 that has a central axis 205 and surrounds each of the middle barrier 120 and lower barrier 122. As a result, outer housing 202 also partially defines each of the chambers 110, 114, 150 previously described above. In particular, outer housing 202 includes a first or upper end 202a, and a second or inner end 202b opposite upper end 202a. Upper chamber 110 is defined within housing 202 between upper end 202a and middle barrier 120, and lower chamber 114 is defined within housing 202 between lower end 202b and lower barrier 122. In addition, middle chamber 150 is defined within housing 202 axially between middle barrier 120 and lower barrier 122. Further, because barriers 120, 122 are disposed within housing 202, they may be mechanical plugs that engage with the inner wall of housing 202 or they may be incorporated or integrated within the walls of housing 202 itself.

Figure 3:
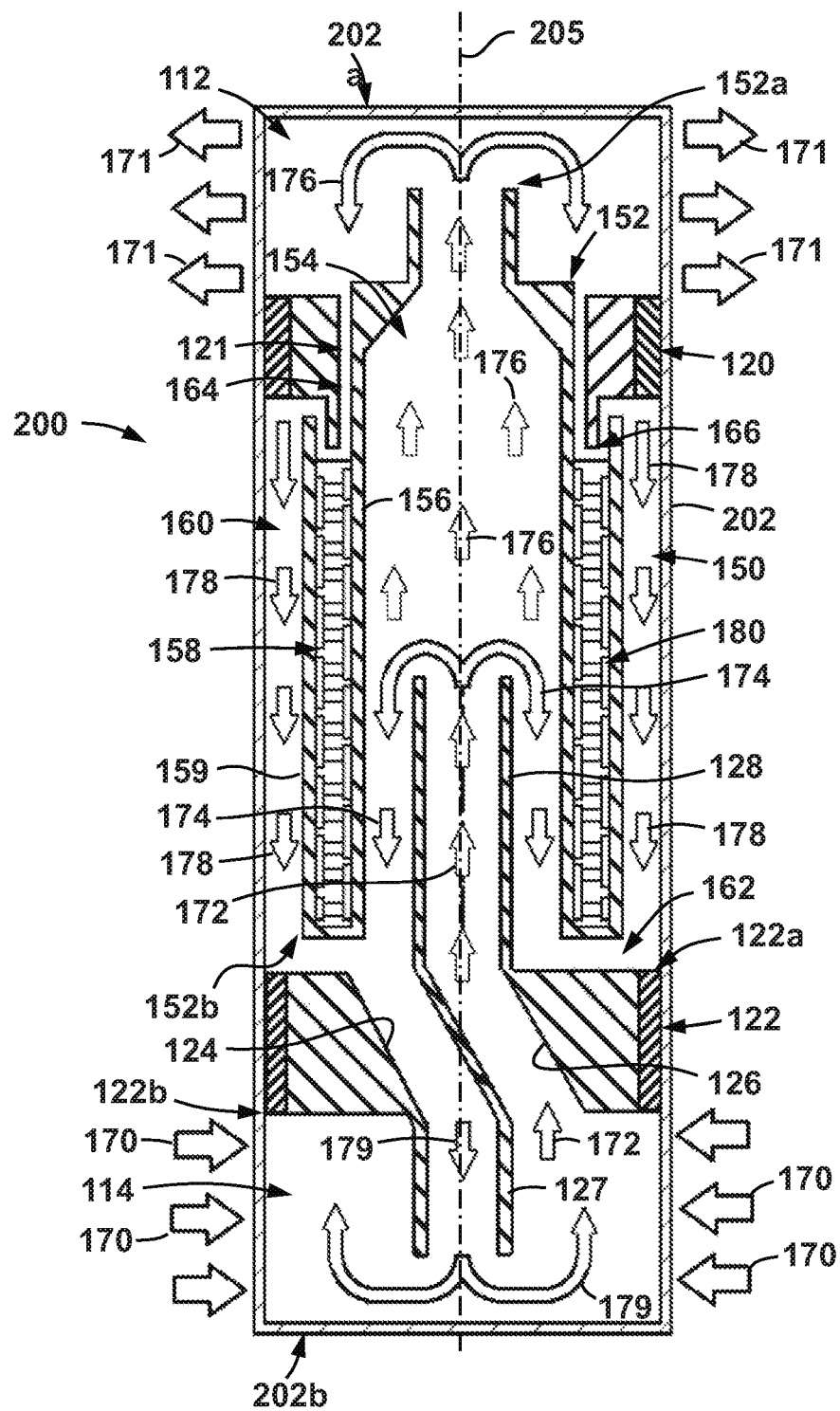
FIG. 3 is a side cross-sectional view of another power generation assembly according to some embodiments disclosed herein.

Referring still to FIG. 3, operations with power generation assembly 200 are substantially the same as those described above for power generation assembly 100, and thus, the details of which are not repeated herein in the interests of brevity. However, because power generation assembly 200 is a self-contained unit, assembly 200 is first lowered into a wellbore (e.g., wellbore 12 in FIG. 1) such that upper and lower chambers 110 and 114, respectively, are disposed at appropriate depths so as to be exposed to a desired temperature difference due to the geothermal temperature gradient of a subterranean wellbore. Once the desired temperature difference is achieved between upper and lower chambers 110 and 114, respectively, operations with power generation assembly 200 (particular the circulation of fluids therein) may be conducted in substantially the same manner as previously described above so that electric current is generated by thermoelectric generator 180. Upon the cessation of operations (e.g., at the end of power generation operations altogether or during maintenance periods), the power generation assembly 200 may be simply pulled to the surface (e.g., surface 4) via appropriate lifting equipment.

In addition, because power generation assembly 200 is a self-contained unit within outer housing 202, it may be operated to generate electrical power in other environments that include a temperature gradient, other than a subterranean wellbore (e.g., wellbore 12). For example, power generation assembly 200 may be placed in any location or apparatus that exposes chambers 110, 114 to different temperatures to thereby drive the circulation of the working fluid contained therein (e.g., ammonia and water as previously described above) to result in the generation of electrical power via thermoelectric generator 180 as previously described above. For example, power generation assembly 200 may be operated in an industrial facility (e.g., chemical plant, refinery, manufacturing facility, etc.) where fluids or materials are circulated at various temperatures in furtherance of other manufacturing or chemical processing operations.

Through use of the power generation assemblies described herein (e.g., power generation assemblies 100, 200), electrical current may be generated from an existing temperature gradient. In some embodiments, the existing temperature gradient may be a temperature gradient disposed within a subterranean wellbore (e.g., such as that associated with an oil and gas well) generated by geothermal energies drawn from the interior of the Earth. Accordingly, these existing temperature gradients may be harnessed to generate electricity for use in other processes or locations.

While exemplary embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the disclosure. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A system, comprising:
    a power generation assembly configured to be enclosed within a wellbore extending from a surface into a subterranean formation along a central axis and comprising:
        a thermoelectric generator;
        a conductor configured to conduct electricity generated by the thermoelectric generator to the surface;
        a first barrier and a second barrier, wherein the first barrier is uphole of the second barrier;
        a first chamber, a second chamber, and a third chamber, wherein the first chamber, the second chamber, and the third chamber are bounded by the first barrier and the second barrier, and wherein the second chamber is downhole from the first chamber and uphole from the third chamber; and
        a central housing defining a central throughbore and an annular flow path in the second chamber;
        wherein the central throughbore and the annular flow path are in fluid communication with the first chamber and the third chamber; and
        wherein the thermoelectric generator is radially positioned between the central throughbore and the annular flow path;
    wherein the power generation assembly is configured to circulate a working fluid through a closed loop in the power generation assembly in response to the receipt of geothermal energy within the subterranean formation, to cause the thermoelectric generator to generate electricity, wherein the annular flow path contains a gas that is different from the working fluid, wherein the working fluid is configured to flow through the gas when flowing through the annular flow path, and wherein the closed loop of the working fluid is entirely disposed within the wellbore.

2. The system of claim 1, wherein a pressure of the working fluid is substantially the same throughout the closed loop in the power generation assembly.

3. The system of claim 1, wherein the gas comprises helium.

4. The power generation assembly of claim 1, further comprising a U-bend in fluid communication between the first chamber and the annular flow path, wherein the U-bend is configured to retain liquid therein to prevent the gas from flowing from the annular flow path into the first chamber.

5. The system of claim 1, wherein the working fluid comprises ammonia and water.

6. The system of claim 1, further comprising an outer housing having a first end and a second end opposite the first end, wherein the first chamber is defined within the outer housing between the first end and the first barrier, and wherein the third chamber is defined within the outer housing between the second end and the second barrier.

7. The system of claim 1, wherein the wellbore is plugged.

8. A system, comprising:
    a power generation assembly configured to be enclosed within a wellbore extending from a surface into a subterranean formation along a central axis and comprising:
        a thermoelectric generator;
        conductor configured to conduct electricity generated by the thermoelectric generator to the surface;
        a first barrier and a second barrier, wherein the first barrier is uphole of the second barrier;
        a third barrier uphole of each of the first barrier and the second barrier, and wherein each of the first barrier, the second barrier, and the third barrier comprise plugs installed within a casing pipe of the wellbore;

a first chamber, a second chamber, and a third chamber, wherein the first chamber, the second chamber, and the third chamber are bounded by the first barrier and the second barrier, and wherein the second chamber is downhole from the first chamber and uphole from the third chamber; and a central housing defining a central throughbore and an annular flow path in the second chamber;

wherein the central throughbore and the annular flow path are in fluid communication with the first chamber and the third chamber; and wherein the thermoelectric generator is radially positioned between the central throughbore and the annular flow path wherein the power generation assembly is configured to circulate a working fluid through a closed loop in the power generation assembly in response to the receipt of geothermal energy within the subterranean formation, to cause the thermoelectric generator to generate electricity, wherein the closed loop of the working fluid is entirely disposed within the wellbore.

9. A power generation assembly for use within a subterranean wellbore, the power generation assembly comprising:

a first barrier and a second barrier spaced from one another within the wellbore along a central axis;

a first chamber, a second chamber, and a third chamber, wherein the first chamber, the second chamber, and the third chamber are bounded by the first barrier and the second barrier, and wherein the second chamber is axially disposed between the first barrier and the second barrier;

a central housing defining a central throughbore and an annular flow path in the second chamber;

a thermoelectric generator disposed within the second chamber radially between the central throughbore and the annular flow path; and a working fluid disposed in each of the first chamber, the second chamber, and the third chamber;

wherein the central throughbore and the annular flow path are in fluid communication with the first chamber and the third chamber; and wherein when the first chamber is exposed to a first temperature and the second chamber is exposed to a second temperature that is higher than the first temperature the working fluid flows in a closed loop through the central throughbore at a third temperature and flows through the annular flow path at a fourth temperature that is less than the third temperature.

10. The power generation assembly of claim 9, wherein the annular flow path contains a gas.

11. The power generation assembly of claim 10, wherein the gas is an inert gas.

12. The power generation assembly of claim 11, wherein the gas comprises helium.

13. The power generation assembly of claim 10, further comprising a U-bend in fluid communication between the first chamber and the annular flow path, wherein the U-bend is configured to retain liquid therein to prevent the gas from flowing from the annular flow path into the first chamber.

14. The power generation assembly of claim 9, wherein the second barrier comprises:

a first flow path extending through the second barrier that is in fluid communication with the central through bore and the third chamber; and a second flow path extending through the second barrier separately from the first flow path, wherein the second flow path is in fluid communication with the annular flow path and the third chamber.

* * * * *